(12) United States Patent
Tsurume et al.

(10) Patent No.: US 8,617,995 B2
(45) Date of Patent: Dec. 31, 2013

(54) MANUFACTURING METHOD OF SEMICONDUCTOR DEVICE

(75) Inventors: Takuya Tsurume, Kanagawa (JP); Akihiro Chida, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/217,543

(22) Filed: Aug. 25, 2011

(65) Prior Publication Data

US 2012/0049340 A1 Mar. 1, 2012

(30) Foreign Application Priority Data

Aug. 26, 2010 (JP) ................................. 2010-189324

(51) Int. Cl.
*H01L 21/461* (2006.01)

(52) U.S. Cl.
USPC .......................................................... 438/693

(58) Field of Classification Search
USPC .......... 438/458, 478, 455, 107, 106, 149, 464
See application file for complete search history.

(56) References Cited

U.S. PATENT DOCUMENTS

| | | | |
|---|---|---|---|
| 6,440,877 B1 | 8/2002 | Yamazaki et al. | |
| 6,798,132 B2 | 9/2004 | Satake | |
| 6,958,490 B2 | 10/2005 | Okamoto et al. | |
| 7,279,194 B2 | 10/2007 | Hiroki et al. | |
| 7,381,285 B2 * | 6/2008 | Kanoh et al. | 156/247 |
| 7,473,928 B1 | 1/2009 | Yamazaki et al. | |
| 7,579,771 B2 | 8/2009 | Yamazaki et al. | |
| 7,595,256 B2 * | 9/2009 | Takayama et al. | 438/458 |
| 7,622,361 B2 * | 11/2009 | Goto et al. | 438/455 |
| 7,663,305 B2 | 2/2010 | Yamazaki et al. | |
| 7,723,209 B2 | 5/2010 | Maruyama et al. | |
| 2003/0196597 A1 | 10/2003 | Yamazaki et al. | |
| 2004/0254282 A1 * | 12/2004 | Suzuki et al. | 524/430 |
| 2007/0065654 A1 * | 3/2007 | Hayashi et al. | 428/306.6 |
| 2009/0058285 A1 * | 3/2009 | Yamazaki et al. | 313/504 |

FOREIGN PATENT DOCUMENTS

| | | | | |
|---|---|---|---|---|
| JP | 9-69638 | | 3/1997 | |
| JP | 9-70886 | | 3/1997 | |
| JP | 2004095760 A | * | 3/2004 | .............. H05K 1/02 |
| JP | 2004-281976 | | 10/2004 | |

* cited by examiner

*Primary Examiner* — Julio J Maldonado
*Assistant Examiner* — Moin Rahman
(74) *Attorney, Agent, or Firm* — Husch Blackwell LLP

(57) ABSTRACT

When a semiconductor device having a surface provided with a flexible protective material is manufactured, the misalignment of the protective material occurs at the time of disposing the protective material or performing adhesion treatment. In the case where the terminal portion over the substrate has a length X of 5 mm or less, by providing a step layer with a thickness of 0.38 X or more and 2 mm or less over the element portion, a space is formed between a surface of the terminal portion and the protective material even though the protective material disposed over the step layer so as to cover the element portion is overlapped with the terminal portion. By using an attaching member including an elastic material with a surface hardness of 50 or more and 100 or less in this state, the protective material and the substrate may be attached to each other.

18 Claims, 3 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device and a method of connecting an external wiring to a semiconductor device.

2. Description of the Related Art

A variety of semiconductor devices including display devices, solar cells, and the like are sometimes used in environments exposed to degrading factors from outside, such as incidence of ultraviolet rays and addition of physical impacts. Therefore, in order to suppress the degrading factors from outside, these semiconductor devices have their surfaces provided with a protective material.

In recent years, a decrease in weight of devices has been required in a variety of fields, and a decrease in weight of devices is one of important subjects even in the aforementioned display devices, solar cells, and the like. As a counter measure, there is a method in which a flexible light-weight material such as a film is used as a protective material (see Patent Document 1 and Patent Document 2).

In general, a semiconductor device includes a region (hereinafter referred to as an element portion) provided with a semiconductor element and a region (hereinafter referred to as a terminal portion) which is connected to an external wiring for exchanging electric power and signals between the element portion and an external device. A film-shaped protective material for protecting the element portion is provided over the element portion. The semiconductor device can be used in a state of being electrically connected with the external device via the external wiring such as an FPC (flexible printed circuit) provided at the terminal portion thereof.

As a method for forming a protective material having flexibility for a semiconductor device, a method in which the protective material is attached to an element portion by using an attaching member (such as a rubber roller) is known (hereinafter this method is referred to as adhesion treatment) (see Patent Document 3).

REFERENCES

[Patent Document 1] Japanese Published Patent Application No. 2004-281976
[Patent Document 2] Japanese Published Patent Application No. H9-69638
[Patent Document 3] Japanese Published Patent Application No. H9-70886

SUMMARY OF THE INVENTION

Since a semiconductor device is used in connection with an external device via an external wiring, it is necessary to prevent a protective material from adhering to a terminal portion. Further, the protective material formed in a film shape for the semiconductor device desirably covers the whole top surface of the element portion in order to suppress the degrading factors from outside.

However, there is a problem in that when the misalignment of the protective material occurs at the time of disposing the protective material over the element portion or performing the adhesion treatment, the protective material adheres on the terminal portion to decrease the yield of the semiconductor device.

The present invention has been made in view of the foregoing technical background. Therefore, it is an object of the present invention to provide a method for manufacturing a semiconductor device with high yield even though the misalignment of the protective material occurs.

Moreover, it is an object of the present invention to provide a method for connecting an external wiring to the semiconductor device in a short period of time.

In order to solve the above problem, a step layer is provided over the element portion in the present invention. Further, attention is focused on the relation between the length of the terminal portion and the thickness of the step layer, and to the hardness of an attaching member.

Specifically, in the case where a substrate has a terminal portion with a length X of 5 mm or less, the step layer may be provided with a thickness of 0.38 X or more and 2 mm or less over the element portion. Further, the protective material and the step layer may adhere to each other by using an attaching member including an elastic material with a surface hardness of 50 or more and 100 or less.

Thus, a certain space is ensured between the terminal portion and the protective material even though the protective material is overlapped with the terminal portion. When the adhesion treatment is performed in this state, the protective material will not adhere to the terminal portion as long as the attaching member including an elastic material with a determined hardness is used.

That is, an aspect of the present invention is a manufacturing method of a semiconductor device, which includes providing a step layer over an element portion of a substrate provided with a terminal portion with a length of X and the element portion, wherein the length X of the terminal portion is 5 mm or less, the thickness of the step layer is 0.38 X or more and 2 mm or less, a protective material having flexibility is disposed over the step layer so as to cover the element portion, and the protective material adheres on the step layer by using an attaching member including an elastic material with a surface hardness of 50 or more and 100 or less.

According to the above aspect of the present invention, by the provision of the step layer with a thickness of 0.38 X or more and 2 mm or less over the element portion, the protective material will not adhere to the terminal portion even though the protective material is disposed so as to overlap with the terminal portion. Accordingly, even though the misalignment of the protective material occurs, the semiconductor device can be manufactured with high yield.

An aspect of the present invention is a manufacturing method of a semiconductor device, in which the protective material and the step layer are welded to each other.

According to the above aspect of the present invention, the bonding interface between the step layer and the protective material can be eliminated. Thus, the step layer and the protective material can adhere to each other more firmly. Accordingly, a highly reliable semiconductor device can be manufactured.

An aspect of the present invention is a manufacturing method of a semiconductor device, which includes providing a conductive material over a terminal portion, disposing an external wiring so as to overlap with the terminal portion in a state where the external wiring is in contact with a step layer, and performing pressurization treatment and heat treatment on the external wiring and the conductive material by using a crimping jig, so that the terminal portion and the external wiring are electrically connected to each other via the conductive material.

According to the above aspect of the present invention, the alignment of the external wiring in a direction of the length of the terminal portion and a θ direction is completed by disposing the external wiring in contact with the step layer. Thus, a semiconductor device whose alignment work is simplified and process work time is reduced at the time of connection with the external wiring can be manufactured.

Note that when "B is formed on A" or "B is formed over A" is explicitly described in this specification, it does not necessarily mean that B is formed in direct contact with A. The expression includes the case where A and B are not in direct contact with each other, i.e., the case where another object is interposed between A and B. Here, each of A and B corresponds to an object (e.g., a device, an element, a circuit, a wiring, an electrode, a terminal, a film, or a layer).

Therefore, for example, when it is explicitly described that a layer B is formed on or over a layer A, it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., the layer C or the layer D) may be a single layer or a plurality of layers.

According to the present invention, the semiconductor device can be manufactured with high yield even though the misalignment of the protective material occurs.

Further, the external wiring can be connected to the semiconductor device in a short period of time.

DETAILED DESCRIPTION OF THE INVENTION

Figure 1A:
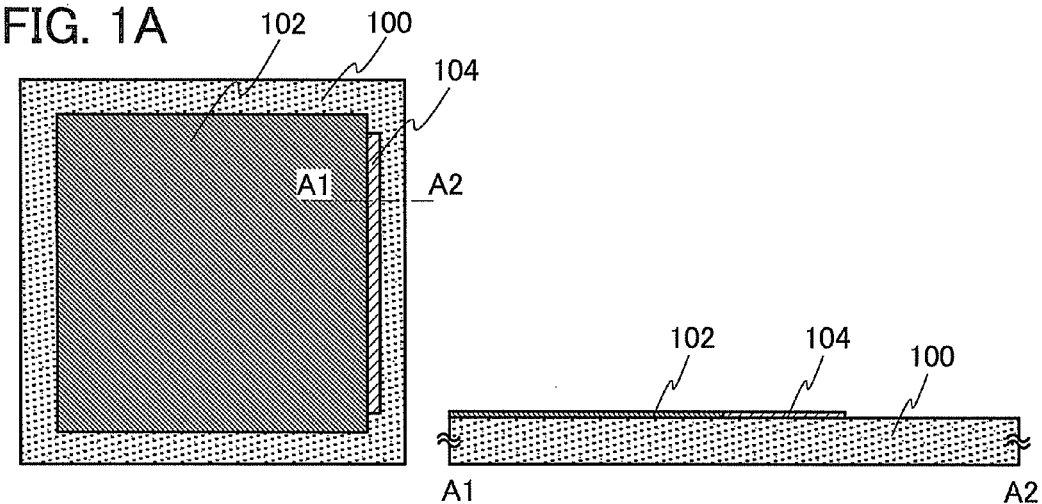
FIGS. 1A to 1C show a manufacturing method of a semiconductor device according to Embodiment 1.

Embodiments are explained in detail with reference to the drawings. Note that the present invention is not limited to the following description, and it will be easily understood by those skilled in the art that various changes and modifications can be made without departing from the spirit and scope of the invention. Therefore, the present invention should not be construed as being limited to the description in the following Embodiments. Note that in the structures of the invention described below, the same portions or portions having similar functions are denoted by the same reference numerals in different drawings, and the description of such portions is not repeated.

Embodiment 1

With reference to FIGS. 1A to 1C and FIGS. 2A to 2C, a method for manufacturing a semiconductor device with high yield even though the misalignment of a protective material occurs at the time of disposing the protective material over an element portion or performing adhesion treatment is described.

First, a substrate 100 provided with an element portion 102 and a terminal portion 104 is prepared (see FIG. 1A).

For example, a glass substrate, a ceramic substrate, a quartz substrate, a sapphire substrate, or the like can be used as the substrate 100. Alternatively, a single-crystal semiconductor substrate of silicon, silicon carbide, or the like, a polycrystalline semiconductor substrate, a compound semiconductor substrate of silicon germanium or the like, an SOI substrate, or the like can be used. Note that any of a variety of plastic substrates can be used as long as the material of the substrate can resist the temperature for forming the element portion 102 and the terminal portion 104.

There have been progresses in a research for forming a semiconductor film by using a polymer material and a research for forming a metal thin film by forming a material including a metal particle by screen printing or droplet discharging such as ink jet printing and adding heat at low temperatures or mechanical stress. Therefore, when the element portion 102 and the terminal portion 104 are formed at low temperatures, any of a variety of engineering plastics and versatile plastics such as polyether sulfone (PES), polyethylene naphthalate (PEN), polyether ether ketone (PEEK), polysulfone (PSF), polyether imide (PEI), polyarylate (PAR), polybutylene terephthalate (PBT), polyamide (PA), polyimide (PI), polyphenylene sulfide (PPS), polytetrafluoroethylene (PTFE), acrylonitrile butadiene styrene (ABS), and polypropyrene (PP) can be used for the substrate 100.

The element portion 102 includes at least one diode and at least one wiring. In view of the signal loss and electric power loss in the semiconductor device, the wiring desirably has a resistivity of $5 \times 10^{-3}$ ($\Omega \cdot cm$) or less after the formation thereof.

Figure 1B:
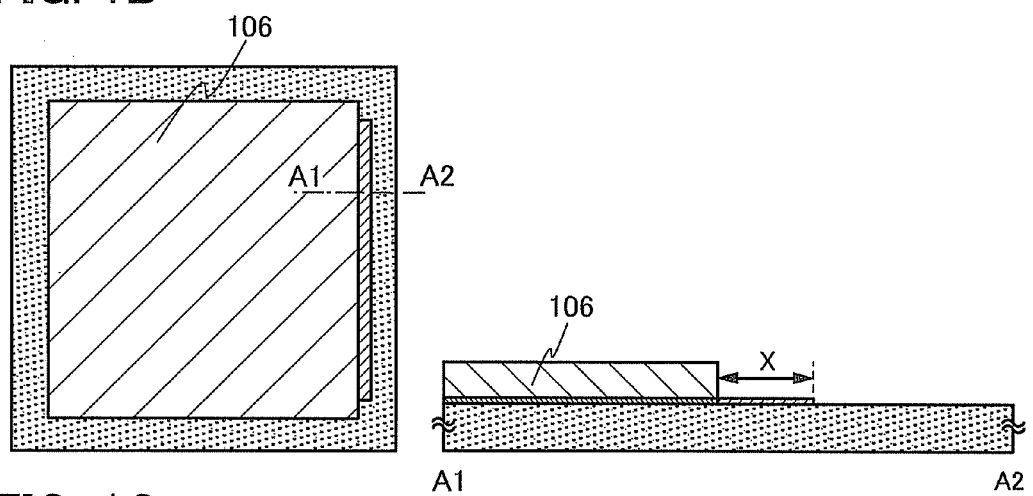
Figure 1C:
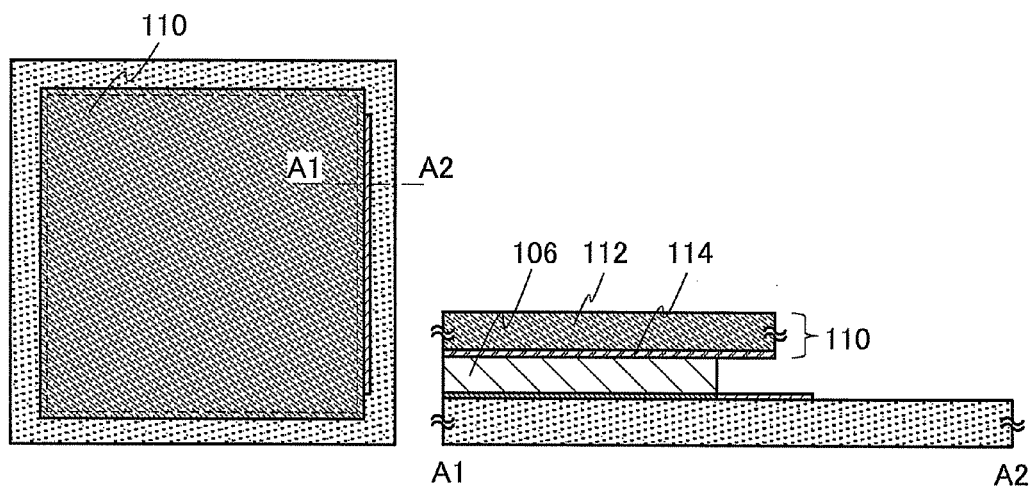

The terminal portion 104 has at least a wiring for exchanging electric power and signals between the element portion 102 and an external device, and the terminal portion 104 has a length of 5 mm or less (the length in the A1-A2 direction of the terminal portion 104 in FIGS. 1A to 1C). As the terminal portion 104 is longer, the area of the element portion 102 in the semiconductor device is smaller; therefore, in order to keep the performance without changing the area of the semiconductor device, it is necessary to increase the degree of integration by decreasing the sizes of diodes and wirings formed in the element portion 102. As the degree of integration is increased, the possibility of a decrease in yield of the semiconductor device increases. Therefore, the length of the terminal portion 104 is preferably 5 mm or less, more preferably 3 mm or less, much more preferably 2 mm or less.

Next, a step layer 106 is formed over the element portion 102. Note that the step layer 106 has a thickness of 0.38 X or more and 2 mm or less where X is the length of the terminal portion 104 (see FIG. 1B). In the case where the step layer 106 has a thickness of less than 0.38 X, when the protective material adheres on the step layer 106 by using an attaching member in a later step, the amount of the protective material that protrudes beyond the step layer to the terminal portion side is large, which might cause the protective material to adhere on a part of the terminal portion 104. In the case where the step layer has a thickness of more than 2 mm, when the protective material adheres on the step layer 106 by using an attaching member in a later step, the force applied by the attaching member concentrates on corners at end portions of the step layer, so that the step layer 106 might be deformed or broken based on these portions.

For the step layer 106, for example, a resin such as a photo-curable resin, a reactive curable resin, or a thermal curable resin can be used, and treatment which is selected in accordance with the material (for example, in the case of using a photo-curable resin, irradiation with light corresponding to the curing wavelength) may be performed for sufficient curing. In the case of using a thermoplastic base as the protective material and welding the step layer 106 and the protective material to each other in a later step for making the protective material adhere on the step layer 106, the step layer 106 is desirably formed of a material with a melting point lower than the temperature of the heat applied at the time of welding.

Note that the material for the step layer 106 may include a moisture-absorption material. This can suppress the moisture entering the element portion from outside, so that the reliability of the semiconductor device whose element portion is sensitive to moisture can be increased.

Although this embodiment shows the step layer 106 provided for the whole surface of the element portion 102, the present invention is not limited thereto. Since the protective material is not attached to the terminal portion 104 as long as the step layer 106 with a predetermined thickness is formed along the interface between the element portion 102 and the terminal portion 104, for example, there may be a part of the element portion 102 which is not provided with the step layer 106.

Next, a protective material 110 including a base 112 and an adhesive material 114 is disposed over the step layer 106 so as to cover the whole surface of the element portion 102.

In the case where the amount of misalignment of the protective material 110 generated at the time of disposing the protective material 110 over the step layer 106 is A, the protective material 110 is desirably disposed so as to have an end portion more outward by at least A than the end portion of the element portion 102. This makes it possible to cover the whole top surface of the element portion even though the amount of misalignment A occurs at the time of disposing the protective material; therefore, the reliability of the semiconductor device can be increased.

As the base 112, for example, a resin thin film, a resin thin film with its surface provided with a protective film, a metal thin film, or the like may be used.

As the above resin thin film, a film including as a component at least one kind or more of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), and polyimide (PI) can be used.

Although this embodiment shows the example of using a single layer for the base 112, the base 112 may be provided with a protective film. As the protective film, for example, an inorganic thin film of silicon oxide ($SiO_2$), silicon nitride (SiN), silicon oxynitride (SiON), or silicon nitride oxide (SiNO), or a thin film including any of aluminum (Al), titanium (Ti), nickel (Ni), chromium (Cr), molybdenum (Mo), tantalum (Ta), beryllium (Be), zirconium (Zr), gold (Au), silver (Ag), copper (Cu), zinc (Zn), iron (Fe), lead (Pb), and tin (Sn) or an alloy including any of them can be used. In particular, a film which transmits less moisture, gas, and an ultraviolet ray is preferable.

As the adhesive material 114, any of a variety of curable adhesive materials such as a photo-curable adhesive material, a reactive curable adhesive material, a thermal curable adhesive material, and an anaerobic adhesive material can be used. As the material of the adhesive material, an epoxy resin, an acrylic resin, a silicone resin, a phenol resin, or the like can be used. Note that a structure body in which a fibrous body is impregnated with an organic resin (also referred to as a prepreg, hereinafter referred to as a prepreg) may be used as the base 112. In the case of using a prepreg as the base 112, the base 112 can directly adhere to the step layer 106 without using the adhesive material. At this time, as the organic resin for the structure body, a reactive curable resin, a thermal curable resin, a UV curable resin, or the like which is better cured by additional treatment is preferably used.

Note that the protective material 110 has a stacked-layer structure including the base 112 and the adhesive material 114 in this embodiment (see FIG. 1C); however, in the case where the base 112 also has a function of the adhesive material 114, for example in the case where the base 112 is partially melted by heat treatment so as to adhere to the step layer 106 (so-called welding), the protective material 110 may have a single layer structure of only the base 112. By welding the base 112 and the step layer 106 to each other, the semiconductor device with high reliability in which the step layer and the protective material adhere to each other more firmly can be manufactured.

Figure 2A:
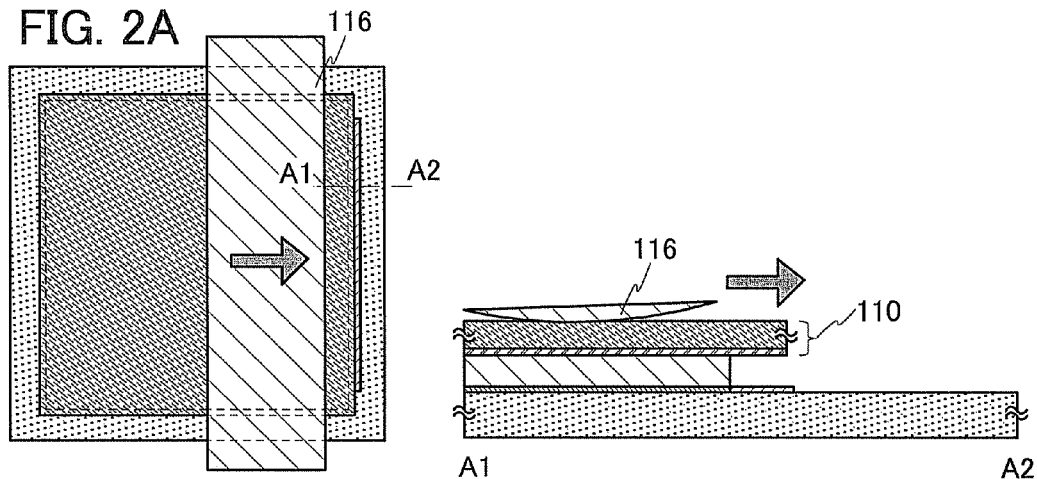
FIGS. 2A to 2C show a manufacturing method of a semiconductor device according to Embodiment 1.

Next, the protective material 110 is made adhere on the step layer 106 by using an attaching member 116 including an elastic material with a surface hardness of 50 or more and 100 or less (see FIG. 2A).

A method for making the protective material 110 adhere on the step layer 106 is preferably selected as appropriate depending on the kind of the adhesive material 114. For example, in the case of using a thermal curable adhesive material as the adhesive material 114, the step layer 106 and the protective material 110 may adhere to each other by pressing the attaching member 116 heated at the temperature of such a degree that the adhesive material is cured.

Although the attaching member 116 is pressed against the protective material 110 in this embodiment, the present invention is not limited to this and the substrate 100 may be pressed against the attaching member 116.

As the elastic material used for the attaching member 116, for example, rubber used for an industrial rubber roller such as natural rubber, isoprene rubber, butadiene rubber, styrene butadiene rubber, nitrile butadiene rubber, butyl rubber, chloroprene acrylic rubber, ethylene propylene rubber, urethane rubber, silicone rubber, fluoro rubber, chlorosulfonated polyethylene rubber, chlorinated polyethylene rubber, acrylic acid ester copolymer rubber, epichlorohydrin copolymer rubber, or organic polysulfide rubber may be used after the hardness thereof is adjusted (for example, by mixing a hardness adjusting agent such as carbon).

Note that the elastic material used for the attaching member 116 desirably has a surface hardness of 50 or more and 100 or less, more desirably 50 or more and 80 or less.

Figure 2B:
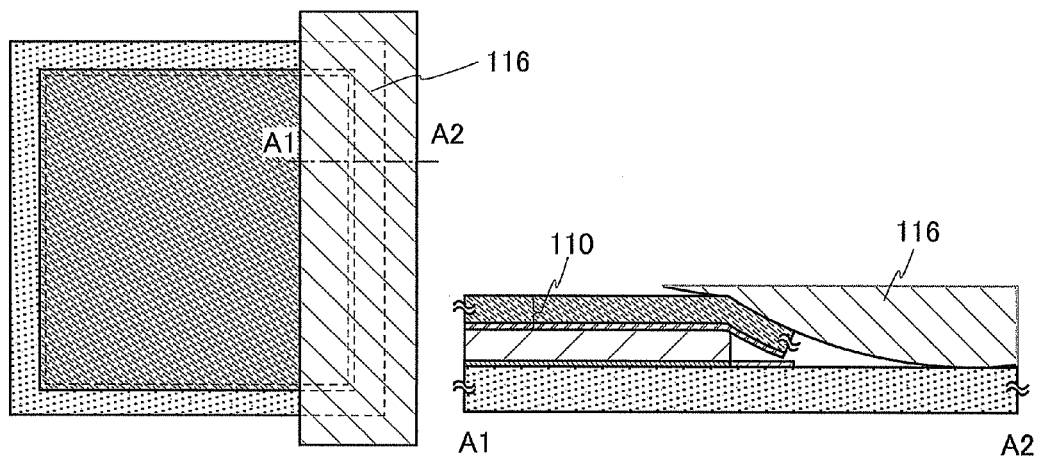

When the surface hardness is 50 or more and 100 or less, the protective material 110 will not adhere to the terminal portion even through the adhesion treatment is performed in a state that the protective material 110 is overlapped with the terminal portion 104 at the time of making the protective material 110 adhere on the step layer 106 with a thickness of 0.38 X (see FIG. 2B). Accordingly, it is possible to manufacture the semiconductor device in which the protective material 110 does not adhere on the terminal portion 104 even though the adhesion treatment is performed with the protective material 110 overlapped with the terminal portion 104.

When the attaching member 116 has a surface hardness of 50 or more and 80 or less, even though the step is formed over the element portion due to mixture of another substance such as particles, the attaching member 116 is deformed following the shape of the step at the time of applying a stress by the attaching member. This can suppress the concentration of stress on the step portion. Therefore, it is possible to suppress a decrease in yield caused when the protective material 110 adheres to the step layer 106.

Further, when the surface hardness is less than 50, i.e., the elastic material is soft, a strong force is applied to the elastic material by corners of the step layer 106 at the time of the adhesion treatment, which might cause a damage to the attaching member 116. Therefore, an elastic material with a surface hardness of less than 50 is not suitable for the use in the attaching member 116.

Although the protective material 110 adheres only to the surface of the step layer 106, the present invention is not limited to this as long as the protective material 110 does not adhere to the terminal portion 104. For example, the protective material 110 may adhere to the substrate 100.

In this case, the protective material 110 sometimes adheres to the substrate 100 in the periphery of the terminal portion 104. If nothing is done, the external wiring cannot be connected in a later step; therefore, an opening portion 118 may be provided in a part of a region of the protective material 110 that overlaps with the terminal portion 104 as shown in FIG. 2C.

Figure 2C:
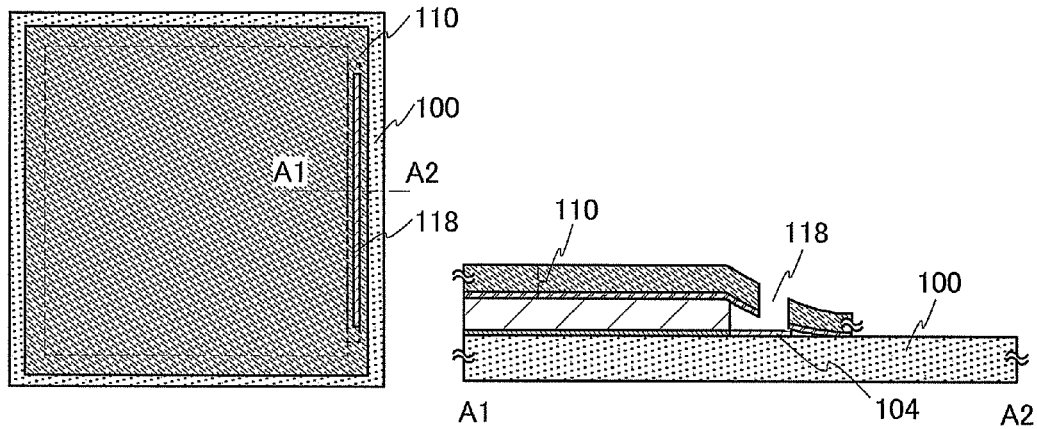

Note that by the adhesion of the protective material 110 to the substrate 100 as shown in FIG. 2C, the entrance of the degrading factors from outside (such as moisture and gas composition) can be suppressed in the portion where the both adhere to each other. Therefore, a highly reliable semiconductor device can be manufactured.

By manufacturing the semiconductor device in accordance with the above method, the protective material will not adhere on the terminal portion even though the misalignment of the protective material occurs.

Therefore, the semiconductor device can be manufactured with high yield.

This embodiment can be combined with another embodiment in this specification as appropriate.

Embodiment 2

Figure 3A:
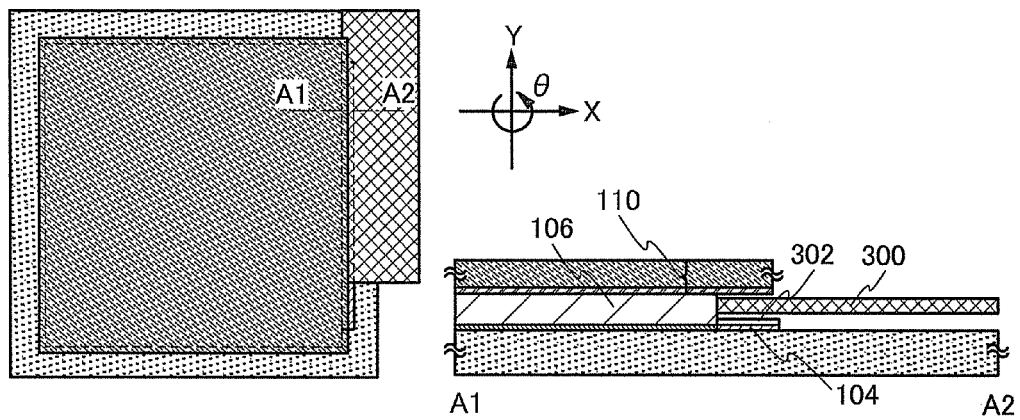
FIGS. 3A to 3C show a manufacturing method of a semiconductor device according to Embodiment 2.
Figure 3B:
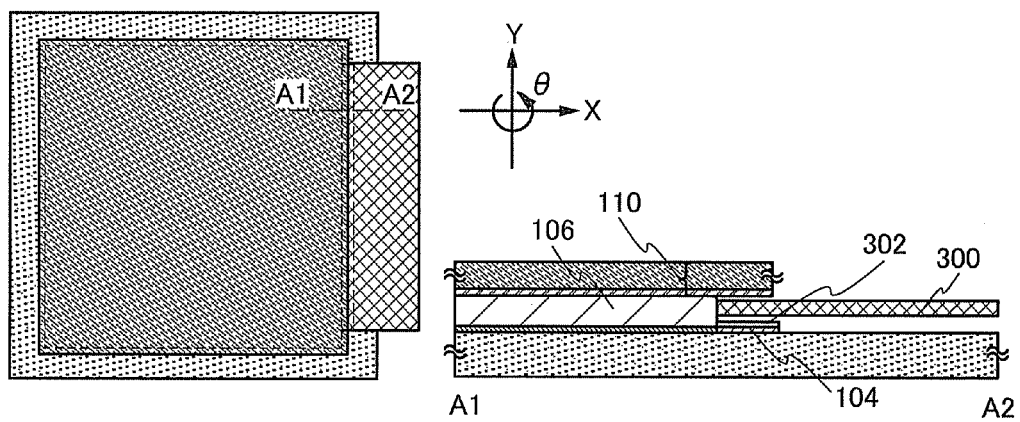
Figure 3C:
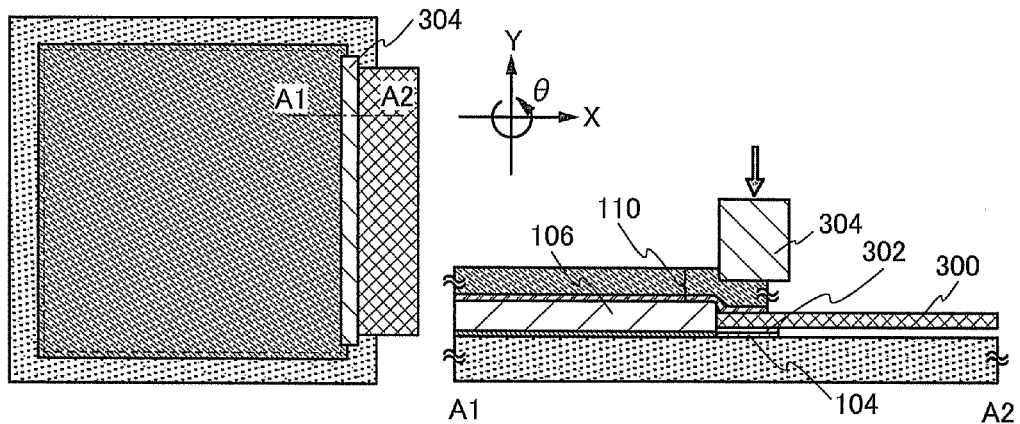

With reference to FIGS. 3A to 3C, this embodiment will explain a method of connecting an external wiring to the semiconductor device manufactured in Embodiment 1, by which the alignment of an external connection terminal and the external wiring can be performed only by the alignment in a uniaxial direction.

First, the semiconductor device manufactured in Embodiment 1 is prepared, and after a conductive material 302 is provided over the terminal portion 104, an external wiring 300 is inserted into a space formed between the terminal portion 104 and the protective material 110 (see FIG. 3A). At this time, by providing an edge face of the external wiring 300 in contact with an edge face of the step layer 106, the misalignment of the external wiring 300 along an X axis and a θ axis can be corrected.

As the conductive material 302, for example, a material including a conductive particle and an organic resin is used. Specifically, a material in which conductive particles each having a diameter of several nanometers to several tens of micrometers are dissolved or dispersed in an organic resin is used. As the conductive particle, a metal particle of one or more of gold (Au), silver (Ag), copper (Cu), nickel (Ni), platinum (Pt), palladium (Pd), tantalum (Ta), molybdenum (Mo), titanium (Ti), aluminum (Al), and carbon (C), an insulating particle (such as a glass particle or an organic resin particle) whose surface is provided with a metal film including any of the above metals, a microparticle of silver halide, or a dispersive nanoparticle can be used. In addition, as the organic resin, one or a plurality of organic resins each serving as a binder, a solvent, a dispersant, or a coating member of the metal particle can be used. Typically, organic resins such as an epoxy resin and a silicone resin can be given. In general, an anisotropic conductive film, an anisotropic conductive paste, or the like is used.

There is no particular limitation on the external wiring 300; however, a structure covered with an insulating layer except the portion thereof to be connected to the terminal portion is preferable. For example, an FPC (flexible printed circuit) or the like may be used.

Next, the alignment of the external wiring 300 is performed in a Y-axis direction (see FIG. 3B). There is no particular limitation on an apparatus to be used in the alignment; an appropriate apparatus selected depending on the material of the external wiring 300 (thickness, hardness, or the like) may be used. Note that in order to suppress defective connection between the terminal portion 104 and the external wiring 300 due to the misalignment of the protective material 110 in the Y-axis direction, the accuracy of the alignment of the apparatus is desirably 200 µm or less, more desirably 50 µm or less.

Note that although the external wiring 300 is disposed in contact with the step layer 106 after providing the conductive material 302 over the terminal portion 104 in this embodiment, the external wiring 300 may be disposed in contact with the step layer 106 after providing the conductive material 302 for the external wiring 300.

Next, the protective material 110, the external wiring 300, the conductive material 302, and the terminal portion 104 are subjected to pressurization treatment and heat treatment by using a crimp jig 304. Accordingly, the terminal portion 104 and the external wiring 300 are electrically connected to each other via the conductive material 302 (see FIG. 3C).

By the aforementioned method, the alignment of the external connection terminal and the external wiring can be performed just by the alignment in a uniaxial direction by using the semiconductor device manufactured in Embodiment 1.

Thus, a semiconductor device whose alignment work is simplified and process work time is reduced at the time of connection with the external wiring can be manufactured.

This embodiment can be combined with another embodiment in this specification as appropriate.

This application is based on Japanese Patent Application serial no. 2010-189324 filed with Japan Patent Office on Aug. 26, 2010, the entire contents of which are hereby incorporated by reference.

What is claimed is:

1. A manufacturing method of a semiconductor device, comprising the steps of:
   forming an element portion comprising a transistor over a substrate;
   forming a terminal portion with a length X of 5 mm or less over the substrate;
   forming a step layer with a thickness of 0.38 X mm or more and 2 mm or less over the element portion;
   disposing a protective material having flexibility over the step layer so that the protective material covers the element portion; and
   adhering the protective material to the step layer by using an attaching member including an elastic material with a surface hardness of 50 or more and 100 or less.

2. The manufacturing method of a semiconductor device according to claim 1, wherein the protective material and the step layer are welded to each other.

3. The manufacturing method of a semiconductor device according to claim 1, further comprising the steps of:
   providing a conductive material over the terminal portion;
   disposing an external wiring in contact with the step layer over the terminal portion; and
   performing pressurization treatment and heat treatment on the external wiring and the conductive material by using a crimp jig, so that the terminal portion is electrically connected to the external wiring via the conductive material.

4. The manufacturing method of a semiconductor device according to claim 1, wherein the protective material is disposed so as to have an end portion more outward than the end portion of the element portion.

5. The manufacturing method of a semiconductor device according to claim 1, wherein the step layer is a photo-curable resin, a reactive curable resin, or a thermal curable resin.

6. The manufacturing method of a semiconductor device according to claim 1, wherein the step layer includes a moisture-absorption material.

7. A manufacturing method of a semiconductor device, comprising the steps of:
  forming an element portion comprising a transistor over a substrate;
  forming a terminal portion with a length X of 5 mm or less over the substrate;
  forming a step layer with a thickness of 0.38 X mm or more and 2 mm or less over the element portion;
  disposing a protective material having flexibility over the step layer and the substrate so that the protective material covers the element portion;
  adhering the protective material to the step layer and the substrate by using an attaching member including an elastic material with a surface hardness of 50 or more and 100 or less; and
  providing an opening in a part of a region of the protective material that overlaps with the terminal portion.

8. The manufacturing method of a semiconductor device according to claim 7, wherein the protective material and the step layer are welded to each other.

9. The manufacturing method of a semiconductor device according to claim 7, further comprising the steps of:
  providing a conductive material over the terminal portion;
  disposing an external wiring in contact with the step layer over the terminal portion; and
  performing pressurization treatment and heat treatment on the external wiring and the conductive material by using a crimp jig, so that the terminal portion is electrically connected to the external wiring via the conductive material.

10. The manufacturing method of a semiconductor device according to claim 7, wherein the protective material is disposed so as to have an end portion more outward than the end portion of the element portion.

11. The manufacturing method of a semiconductor device according to claim 7, wherein the step layer is a photo-curable resin, a reactive curable resin, or a thermal curable resin.

12. The manufacturing method of a semiconductor device according to claim 7, wherein the step layer includes a moisture-absorption material.

13. A manufacturing method of a semiconductor device, comprising the steps of:
  forming an element portion comprising a transistor over a substrate;
  forming a terminal portion over the substrate;
  forming a step layer over the element portion;
  disposing a protective material having flexibility over the step layer so that the protective material covers the element portion; and
  adhering the protective material to the step layer by using an attaching member including an elastic material,
  wherein the element portion and the terminal portion are arranged to be substantially flush with each other.

14. The manufacturing method of a semiconductor device according to claim 13, wherein the protective material and the step layer are welded to each other.

15. The manufacturing method of a semiconductor device according to claim 13, further comprising the steps of:
  providing a conductive material over the terminal portion;
  disposing an external wiring in contact with the step layer over the terminal portion; and
  performing pressurization treatment and heat treatment on the external wiring and the conductive material by using a crimp jig, so that the terminal portion is electrically connected to the external wiring via the conductive material.

16. The manufacturing method of a semiconductor device according to claim 13, wherein the protective material is disposed so as to have an end portion more outward than the end portion of the element portion.

17. The manufacturing method of a semiconductor device according to claim 13, wherein the step layer is a photo-curable resin, a reactive curable resin, or a thermal curable resin.

18. The manufacturing method of a semiconductor device according to claim 13, wherein the step layer includes a moisture-absorption material.

* * * * *